United States Patent
Becker et al.

(10) Patent No.: US 9,075,468 B2
(45) Date of Patent: Jul. 7, 2015

(54) DEVICE FOR CONTROLLING MULTIPLE DIFFERENT FUNCTIONS OF A MOTOR VEHICLE

(75) Inventors: Christian Becker, Ingolstadt (DE); Imanuel Merk, Rio de Janeiro (BR); Mattijs Van Tuijl, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 13/983,693

(22) PCT Filed: Feb. 1, 2012

(86) PCT No.: PCT/EP2012/000435
§ 371 (c)(1),
(2), (4) Date: Oct. 23, 2013

(87) PCT Pub. No.: WO2012/104070
PCT Pub. Date: Aug. 9, 2012

(65) Prior Publication Data
US 2014/0055397 A1   Feb. 27, 2014

(30) Foreign Application Priority Data
Feb. 3, 2011   (DE) .................. 10 2011 010 229

(51) Int. Cl.
*G06F 3/041* (2006.01)
*B60K 35/00* (2006.01)
(Continued)

(52) U.S. Cl.
CPC ............... *G06F 3/041* (2013.01); *B60K 35/00* (2013.01); *B60K 37/06* (2013.01); *B60K 2350/1004* (2013.01); *B60K 2350/1016* (2013.01); *B60K 2350/1028* (2013.01); *B60K 2350/1032* (2013.01); *B60K 2350/1036* (2013.01); *B60K 2350/104* (2013.01); *G06F 3/04847* (2013.01);
(Continued)

(58) Field of Classification Search
None
See application file for complete search history.

(56) References Cited

U.S. PATENT DOCUMENTS 5,889,242 A * 3/1999 Ishihara et al. ............... 200/6 A
6,067,078 A * 5/2000 Hartman ........................ 345/168
(Continued)

FOREIGN PATENT DOCUMENTS

CN   1330595   1/2002
DE   19929587   1/2001
(Continued)

OTHER PUBLICATIONS

English language International Search Report for PCT/EP2012/000435, mailed Aug. 6, 2012, 2 pages.
(Continued)

*Primary Examiner* — Yong H Sim
(74) *Attorney, Agent, or Firm* — Staas & Halsey LLP

(57) ABSTRACT

An apparatus for the operator control of a plurality of different functions in a motor vehicle has a touch-sensitive display panel that can be used to display at least some of the controllable functions by respective symbols associated with the respective function. The symbols can be moved on the display panel by a combined touch and displacement movement in order to bring the respective function to be controlled to a fixed operator control position on the display panel at which operator control of the respective function is possible. The apparatus furthermore has an operator control device that is separate from the display panel and that has at least one operator control element arranged adjacent to the operator control position, for controlling the selected function.

17 Claims, 2 Drawing Sheets

(51) Int. Cl.
  *B60K 37/06* (2006.01)
  *G06F 3/0484* (2013.01)
  *G06F 3/0485* (2013.01)
  *G06F 3/0488* (2013.01)
  *H03K 17/96* (2006.01)

(52) U.S. Cl.
  CPC .......... *G06F 3/0485* (2013.01); *G06F 3/04886* (2013.01); *G06F 2203/014* (2013.01); *H03K 17/96* (2013.01); *H03K 2217/96054* (2013.01)

(56) References Cited

U.S. PATENT DOCUMENTS

| | | | |
|---|---|---|---|
| 6,529,804 B1* | 3/2003 | Draggon et al. | 701/1 |
| 7,671,851 B1* | 3/2010 | Pryor | 345/184 |
| 8,302,032 B2* | 10/2012 | Shin et al. | 715/862 |
| 2004/0118664 A1 | 6/2004 | DePue et al. | |
| 2004/0155907 A1 | 8/2004 | Yamaguchi et al. | |
| 2008/0022228 A1* | 1/2008 | Kwon et al. | 715/838 |
| 2008/0055273 A1* | 3/2008 | Forstall | 345/173 |
| 2008/0249682 A1 | 10/2008 | Wisniewski et al. | |
| 2011/0107272 A1* | 5/2011 | Aguilar | 715/853 |

FOREIGN PATENT DOCUMENTS

| | | |
|---|---|---|
| DE | 20018474 | 1/2001 |
| DE | 10125165 | 10/2002 |
| DE | 10315841 | 8/2004 |
| DE | 102004014748 | 10/2005 |
| DE | 102004031659 | 6/2006 |
| DE | 102006032118 | 1/2008 |
| DE | 202007018420 | 6/2008 |
| DE | 102007005026 | 8/2008 |
| DE | 102007039442 | 2/2009 |
| DE | 102008020251 | 10/2009 |
| DE | 102008021186 | 10/2009 |
| DE | 102009031649 | 1/2011 |
| DE | 102010020895 | 11/2011 |
| EP | 0839682 | 5/1998 |
| EP | 1469375 | 10/2004 |
| EP | 2055522 | 5/2009 |
| WO | 99/35008 | 7/1999 |
| WO | 03/036455 | 5/2003 |

OTHER PUBLICATIONS

WIPO English language translation of International Preliminary Report on Patentability, downloaded from WIPO Aug. 5, 2013, 6 pages.

* cited by examiner

DEVICE FOR CONTROLLING MULTIPLE DIFFERENT FUNCTIONS OF A MOTOR VEHICLE

CROSS REFERENCE TO RELATED APPLICATIONS

This application is based on and hereby claims priority to International Application No. PCT/EP2012/000435 filed on Feb. 1, 2012 and German Application No. 10 2011 010 229.9 filed on Feb. 3, 2011, the contents of which are hereby incorporated by reference.

BACKGROUND

The invention relates to an apparatus for operator control of a plurality of different functions in a motor vehicle, having a touch-sensitive display panel.

An apparatus of the generic type is known from DE 10 2007 039 442 A1. In this case, a plurality of objects associated with respective devices in the vehicle form a virtual ring that is presented on a display.

U.S. 2008/0249682 A1 describes a similar apparatus having a display that can be configured in various ways.

DE 10 2007 005 026 A1 describes a display and operator control apparatus that is intended to allow simpler and more intuitive use of different vehicle functions. To this end, display and operator control contexts are linked to one another in a closed chain and can be moved by push controls or rotary controls. However, this known apparatus requires a very large number of operator control elements, which significantly complicates operator control thereof.

SUMMARY

It is therefore one potential object to provide an apparatus for the operator control of a plurality of different functions in a motor vehicle, that has the smallest possible number of operator control elements and can nevertheless be operated as intuitively as possible. The inventors propose a device a touch-sensitive display panel to display at least some of the controllable functions with respective symbols, each symbol being associated with a respective function, the symbols being displayed on the display panel at positions that are movable by a combined touch and displacement movement. The display panel has a fixed operator control position such that when a selected symbol is moved to the operator control position, operator control is possible of a respective selected function associated with the selected symbol. The device also has an operator control device separate from the display panel and adjacent to the operator control position of the display panel. The operator control device has an operator control element to control the selected function. The operator control element has at least two different control directions to control the selected function in different ways. The operator control element is rotatable about an axis of rotation with respect to the operator control device, to control the selected function.

The proposed apparatus firstly allows very simple operator control and secondly requires an extremely small number of components, namely just the display panel and the at least one operator control element, which results in a very low space requirement for the apparatus and hence allows said apparatus to be easily integrated into the interior of a motor vehicle. The mechanical complexity of the apparatus can also be reduced on account of the small number of components, which also reduces the number of seams, meaning that a very agreeable design is possible. The low mechanical complexity also advantageously allows the production of the apparatus to be simplified, leading to lower manufacturing costs. A further advantage of the apparatus is the high level of clarity thereon on account of the small number of components.

According to the proposal, provision is furthermore made for the operator control element to be able to be operated in at least two different directions in order to control the selected function in different ways. Such an embodiment of the operator control element is advantageous because most functions of the motor vehicle that are controlled from the interior can be controlled in two different directions, as is the case when adjusting a temperature, the level or distribution of a blower or else when adjusting a volume, for example.

Particularly simple—owing to the intuitive nature—operator control of the apparatus is obtained by the operator control device and/or the operator control element for controlling the selected function being mounted so as to be able to rotate about an axis of rotation. In particular, this also ensures that operation is possible in the two different directions.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
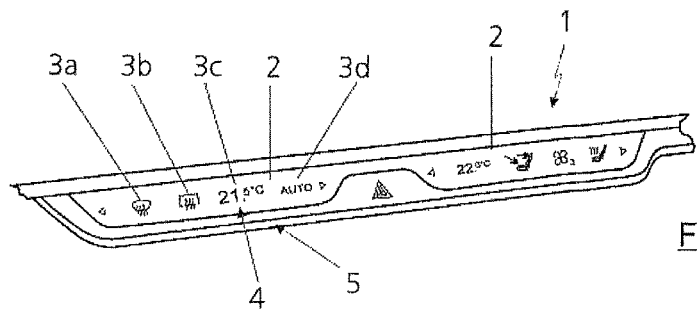
FIG. 1 shows a plan view of the proposed apparatus in a first operator control state.

Reference will now be made in detail to the preferred embodiments of the present invention, examples of which are illustrated in the accompanying drawings, wherein like reference numerals refer to like elements throughout.

FIG. 1 shows an apparatus 1 that is used for controlling a plurality of different functions in a motor vehicle and is preferably arranged in a central console or at a similar location in the interior of the motor vehicle. The apparatus 1 has at least one, in the present case two, display panels 2 at a distance from one another which are used, during the operation of the apparatus 1, which usually coincides with the operation of the motor vehicle, to display at least some of the functions that can be controlled using the apparatus 1 by respective symbols 3 that are associated with the respective function to be controlled. Since the functions of the two display panels 2 are substantially identical, only the left-hand display panel 2, which is tailored to the driver of the motor vehicle, is described below, while the right-hand display panel 2, which is tailored to the front-seat passenger, is not described in more detail.

In the present case, the left-hand display panel 2 shows a symbol 3a for heating of a windshield, a symbol 3b for heating of a rear window, a symbol 3c for an interior temperature and a symbol 3d for an automatic mode for an air conditioning system. It goes without saying that the presented symbols 3a to 3d are intended to be regarded merely as examples and it is possible for a wide variety of different functions to be presented on the display panel 2 by appropriate symbols 3 and controlled using the apparatus 1 as described in more detail below. In particular, it is also possible for other devices in the motor vehicle to be controlled using the apparatus 1, such as a navigation appliance, a radio or other entertainment appliances or else various assistance systems in the motor vehicle.

Figure 2:
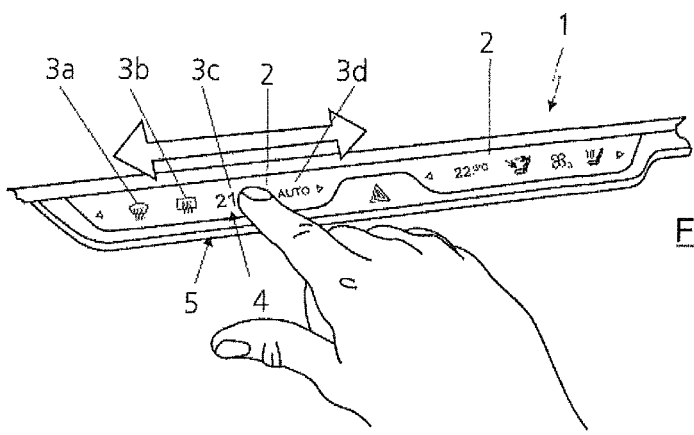
FIG. 2 shows the apparatus from FIG. 1 in a second operator control state.
Figure 3:
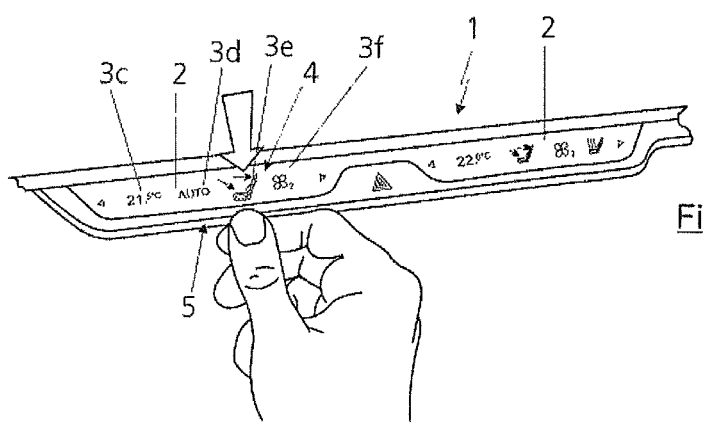
FIG. 3 shows the apparatus from FIG. 1 in a third operator control state.

The display panel 2 is of a touch-sensitive design and the symbols 3 can be moved on the display panel 2 by combined touch and displacement movement in order to bring the respective function to be controlled to a fixed operator control position, which is denoted by the reference symbol 4 and the significance of which will be explained at a later time, on the display panel 2. The operator control position 4 is preferably situated in a central area of the display panel 2. The apparatus 1 may have a function according to which a particular one of the symbols 3 is returned to the operator control position 4 after a particular time, for example the symbol 3c associated with the interior temperature. The displacement of the symbols 3 on the display panel 2 can be seen from a comparison of FIGS. 2 and 3 and is indicated by the large arrow in FIG. 2. Whereas, in the state shown in FIG. 2, the aforementioned symbols 3a, 3b, 3c and 3d are situated on the display panel 2, the displacement movement has pushed down the symbols 3a and 3b from the display panel 2 leftward and at the same time two further symbols, namely a symbol 3e for the distribution of the ventilation in the interior of the motor vehicle and a symbol 3f for the level of a blower, have been pushed onto the display panel 2 from the right. Whereas, in the state in FIG. 2, the symbol 3c for the level of the temperature was situated at the operator control position 4, the symbol 3e for the blower distribution is situated at operator control position 4 in the state shown in FIG. 3. Furthermore, it can be seen that the respective function situated at the operator control position 4 is presented on the display panel 2 in visually highlighted form. In the state shown in FIG. 1 and FIG. 2, the symbol 3c is thus presented in highlighted form, whereas in the state shown in FIG. 3 the symbol 3e is presented in a highlighted form. In the present case, this is achieved by enlarging the symbol 3c or 3e, but other solutions are also conceivable, e.g. brighter presentation of the respective symbol 3.

In the present case, four symbols are displayed on the display panel 2 simultaneously. In order firstly to keep down the size of the apparatus 1 and secondly to require as few displacement movements as possible from the operator, it is particularly advantageous if the display panel 2 displays at least three symbols 3 simultaneously and when further symbols 3 can be moved onto the display panel 2 by the combined touch and displacement movement, as has been described above for the symbols 3e and 3f.

In order to be able to control the function situated at the operator control position 4, that is to say in the present case the blower distribution represented by the symbol 3e, the apparatus 1 has an operator control device 5 that is separate from the display panel 2 and that generally has at least one operator control element 6, arranged adjacent to the operator control position 4, for controlling the selected function, i.e. the function situated at the operator control position 4. The statement "operator control device 5 that is separate from the display panel 2" relates to the fact that the function is not operated by touching the display panel 2. The second display panel 2 also has an associated operator control device 5 with at least one operator control element 6. The control of the function linked to the symbol 3e is indicated by the large arrow in FIG. 3.

Figure 4:
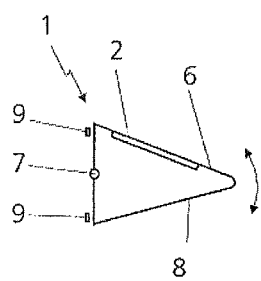
FIG. 4 shows a first embodiment of the operator control device of the proposed apparatus.
Figure 5:
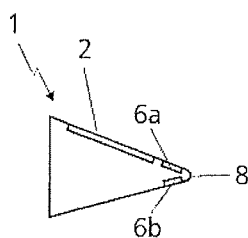
FIG. 5 shows a second embodiment of the operator control device of the proposed apparatus.
Figure 6:
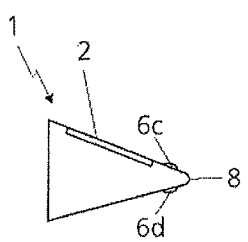
FIG. 6 shows a third embodiment of the operator control device of the proposed apparatus.

FIGS. 4, 5 and 6 show various embodiments of the operator control device 5 in highly schematic form. A common feature of all of the embodiments is that the operator control element 6 can be operated in at least two different directions, which means that, by way of example, the temperature can be increased in one direction and decreased in the other direction. Even when the function associated with the symbol 3 is intended to be just switched on or off, such an embodiment with an operator control element 6 that can be operated in two different directions may be advantageous.

In the embodiment of the operator control device 5 that is shown in FIG. 4, the operator control element 6 is mounted so as to be able to rotate about an axis of rotation 7, which means that the function to be controlled can be controlled in different ways by pushing the operator control element 6 downward or pulling it upward, as indicated by the arrow. The operator control device 5 has a frame 8 that surrounds at least a portion of the display panel 2 and that, in the embodiment in FIG. 4, forms the operator control element 6 that can swivel about the axis of rotation 7. In the case illustrated, in which two display panels 2 are provided, the frame 8 may form the operator control element 6 for both display panels 2. The frame 8 is preferably made of metal, for example aluminum or stainless steel, which confers on the frame 8 not only durability but also a high-quality appearance. Furthermore, the operator control device 5 has two switches 9 that are associated with the operator control element 6, which are operated by tilting the operator control element 6 and hence forward the signal initiated by the operator by the operator control element 6 to a control device, which is not shown. In addition, the switches 9 can provide the operator with audible and/or haptic feedback.

In the embodiment of the operator control device 5 shown in FIG. 5, opposite sides of the frame 8 hold two touch-sensitive operator control elements 6a and 6b that are used to control the respective function. By way of example, the upper operator control element 6a in this case can be used to increase the temperature, the blower power, the audio volume or another function, while the operator control element 6b arranged on the underside of the frame 8 may be provided for the purpose of decreasing the magnitude of the respective function.

A further embodiment of the operator control device 5 of the apparatus 1 is shown in FIG. 6. In this case, opposite sides of the operator control device 5, in this case the frame 8 of the operator control device 5, hold two operator control elements 6c and 6d in the form of pushbutton switches. The operator control elements 6c and 6d in the form of pushbutton switches can be operated in a similar manner to that in which the touch-sensitive operator control elements 6a and 6b in FIG. 5 are operated.

In the embodiments shown in FIGS. 5 and 6, the frame 8 is preferably of rigid design. The embodiments shown in FIGS. 5 and 6 may also have the operator control element 6 designed such that it provides the operator with audible and/or haptic feedback, additional measures possibly being necessary in order to achieve this, particularly in the case of the touch-sensitive operator control elements 6a and 6b.

The whole apparatus 1 may be integrated in the interior of the motor vehicle in the manner of a module, with various functions that are able to be controlled using the apparatus 1 being able to be integrated by changing the respective software. Such a software change can also be used to influence the number and arrangement of the symbols 3 on the display panel 2.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. An apparatus for operator control of a plurality of different functions in a motor vehicle, comprising:
    a touch-sensitive display panel to display at least some of the controllable functions with respective symbols, each symbol being assigned a respective function, the symbols being arranged on the display panel in a first direction and being displayed on the display panel at positions that are movable by a combined touch and displacement movement in the first direction, the display panel having a fixed operator control position such that when a selected symbol which is assigned a respective selected function is moved in the first direction toward the operator control position, operator control via an operator control device is possible of the respective selected function assigned to the selected symbol which is disposed at the operator control position; and
    the operator control device is separate from the display panel and adjacent to the operator control position of the display panel, the operator control device having an operator control element to control the selected function, wherein
    the operator control element has at least two different control directions to control the selected function in different ways,
    the operator control element is rotatable about an axis of rotation with respect to the operator control device, to control the selected function, and
    the axis of rotation of the operator control device is parallel to a plane of the display panel and to the first direction.

2. The apparatus as claimed in claim 1, wherein the operator control position is situated in a central area of the display panel.

3. The apparatus as claimed in claim 1, wherein the selected symbol is presented on the display panel in visually highlighted form.

4. The apparatus as claimed in claim 1, wherein the operator control element is designed such that it provides an operator with audible and/or haptic feedback.

5. The apparatus as claimed in claim 1, wherein the display panel displays at least three symbols simultaneously, and further symbols are moved onto the display panel by the combined touch and displacement movement.

6. The apparatus as claimed in claim 5, wherein the combined touch and displacement movement scrolls through the at least three symbols and the further symbols without changing a relative ordering of the symbols.

7. The apparatus as claimed in claim 6, wherein moving one of the further symbols onto the display panel causes one of the at least three symbols displayed on the display panel, to be moved off of the display panel.

8. The apparatus as claimed in claim 1, wherein the apparatus comprises two display panels at a distance from one another with respective symbols and respective operator control devices.

9. The apparatus as claimed in claim 1, wherein the apparatus comprises:
    a first display panel and a first operator control device within reach of a motor vehicle driver; and
    a second display panel and a second operator control device within reach of a motor vehicle passenger.

10. The apparatus as claimed in claim 1, wherein
    the selected function is selected from the group consisting of heating of a windshield, heating of a rear window, and an interior temperature,
    the operator control element controls the selected function in a first way by increasing the selected function, and
    the operator control element controls the selected function in a second way by decreasing the selected function.

11. The apparatus as claimed in claim 10, wherein
    rotating the operator control element in an upward direction relative to an operator increases the selected function, and
    rotating the operator control element in a downward direction relative to the operator decreases the selected function.

12. An apparatus for operator control of a plurality of different functions in a motor vehicle, comprising:
    a touch-sensitive display panel to display at least some of the controllable functions with respective symbols, each symbol being associated with a respective function, the symbols being displayed on the display panel at positions that are movable by a combined touch and displacement movement, the display panel having a fixed operator control position such that when a selected symbol is moved to the operator control position, operator control via an operator control device is possible of a respective selected function associated with the selected symbol; and
    the operator control device is separate from the display panel and adjacent to the operator control position of the display panel, the operator control device having an operator control element to control the selected function,
    wherein
    the operator control device includes a frame which forms the operator control element, the frame surrounding a portion of the display panel,
    an upper surface and a lower surface of the frame each include an operator control element, and
    the operator control elements on the upper surface and the lower surface of the frame include pushbutton switches, or the operator control elements on the upper surface and the lower surface of the frame are touch-sensitive.

13. The apparatus as claimed in claim 1, wherein
    the operator control element is tilted in an upward direction relative to the axis of rotation to activate a first switch and tilted in a downward direction relative to the axis of rotation to activate a second switch, to control the selected function.

14. The apparatus as claimed in claim 12, wherein
    the frame is formed of aluminum or stainless steel.

15. An apparatus for operator control of a plurality of different functions in a motor vehicle, comprising:
    a touch-sensitive display panel to display at least some of the controllable functions with respective symbols, each symbol being associated with a respective function, the symbols being displayed on the display panel at positions that are movable by a combined touch and displacement movement, the display panel having a fixed operator control position such that when a selected symbol is moved to the operator control position, operator control via an operator control device is possible of a respective selected function associated with the selected symbol; and the operator control device is separate from the display panel and adjacent to the operator control position of the display panel, the operator control device having an operator control element to control the selected function, wherein the operator control element has at least two different control directions to control the selected function in different ways, the operator control element is rotatable about an axis of rotation with respect to the operator control device, to control the selected function, the operator control device includes a frame which forms the operator control element, the frame surrounding a portion of the display panel, the frame includes an upper surface and a lower surface, the display panel is disposed on the upper surface of the frame, and the operator control element controls the selected function in a first manner via an application of force on the upper surface of the frame and in a second manner via an application of force on the lower surface of the frame.

16. The apparatus as claimed in claim 1, wherein the first direction is a horizontal direction.

17. An apparatus for operator control of a plurality of different functions in a motor vehicle, comprising:

a touch-sensitive display panel to display at least some of the controllable functions with respective symbols, each symbol being assigned a respective function, the symbols being arranged on the display panel in a first direction and being displayed on the display panel at positions that are movable by a combined touch and displacement movement in the first direction, the display panel having a fixed operator control position such that when a selected symbol which is assigned a respective selected function is moved in the first direction toward the operator control position, operator control via an operator control device is possible of the respective selected function assigned to the selected symbol which is disposed at the operator control position; and the operator control device is separate from the display panel and adjacent to the operator control position of the display panel, the operator control device having an operator control element to control the selected function, wherein the operator control element has at least two different control directions to control the selected function in different ways, the operator control element is rotatable about an axis of rotation with respect to the operator control device, to control the selected function, and the operator control device includes a frame which surrounds a portion of the display panel, the frame includes an upper surface and a lower surface, the display panel is disposed on the upper surface of the frame, and the upper surface and lower surface of the frame each include an operator control element which controls the selected function differently from one another.

* * * * *